United States Patent
Hsieh

(10) Patent No.: US 7,205,602 B2
(45) Date of Patent: Apr. 17, 2007

(54) METHOD TO IMPROVE THE COUPLING RATIO OF TOP GATE TO FLOATING GATE IN FLASH

(75) Inventor: Chia-Ta Hsieh, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 11/258,423

(22) Filed: Oct. 25, 2005

(65) Prior Publication Data

US 2006/0046410 A1 Mar. 2, 2006

Related U.S. Application Data

(62) Division of application No. 10/437,374, filed on May 13, 2003, now abandoned, which is a division of application No. 10/224,152, filed on Aug. 20, 2002, now Pat. No. 6,579,761, application No. 11/258,423, which is a division of application No. 10/307,617, filed on Dec. 2, 2002, now Pat. No. 6,916,722.

(51) Int. Cl.
 *H01L 29/76* (2006.01)
(52) U.S. Cl. ............... 257/315; 257/317; 257/390; 257/E27.103; 257/E29.3
(58) Field of Classification Search ........... 257/315, 257/316, 317, 321, 324, E29.129, E29.309, 257/390, 391, E27.103, E29.3
See application file for complete search history.

(56) References Cited

U.S. PATENT DOCUMENTS

| | | | |
|---|---|---|---|
| 6,034,393 A | 3/2000 | Sakamoto et al. | 257/315 |
| 6,130,129 A | 10/2000 | Chen | 438/257 |
| 6,140,182 A | 10/2000 | Chen | 438/259 |
| 6,153,494 A | 11/2000 | Hsieh et al. | 438/424 |
| 6,225,162 B1 | 5/2001 | Lin et al. | 438/261 |
| 6,312,989 B1 | 11/2001 | Hsieh et al. | 438/257 |
| 6,461,916 B1 | 10/2002 | Adachi et al. | 438/257 |
| 6,500,710 B2 | 12/2002 | Nakagawa | 438/257 |
| 6,589,840 B2 | 7/2003 | Tseng | 438/257 |
| 2002/0102793 A1* | 8/2002 | Wu | 438/257 |

* cited by examiner

*Primary Examiner*—Minh-Loan Tran
(74) *Attorney, Agent, or Firm*—Thomas, Kayden, Horstemeyer & Risley

(57) ABSTRACT

A structure is disclosed to improve the coupling ratio of top gate to floating gate in flash memory cells. Parallel active regions are surrounded by isolation regions and are disposed over a semiconductor region of a substrate. The isolation regions have a portion within and a portion above the semiconductor region. The semiconductor region under the active regions is doped in the vicinity of the surface to adjust the threshold voltage Insulator spacers are disposed against the sidewalls of the portion of the isolation regions that are above the semiconductor region and they taper so they are wider near the semiconductor region, and the spacing between neighboring insulator spacers on the same active region decreases closer to the semiconductor region Conductive floating gates spaced along the active regions are separated from the semiconductor region by a floating gate insulator layer, are disposed between insulator spacers and extend about to the height of the isolation regions. Top gates comprised of conductive stripes that are perpendicular to the active regions, are disposed over floating gates from which they are separated by a top gate insulator layer.

9 Claims, 7 Drawing Sheets

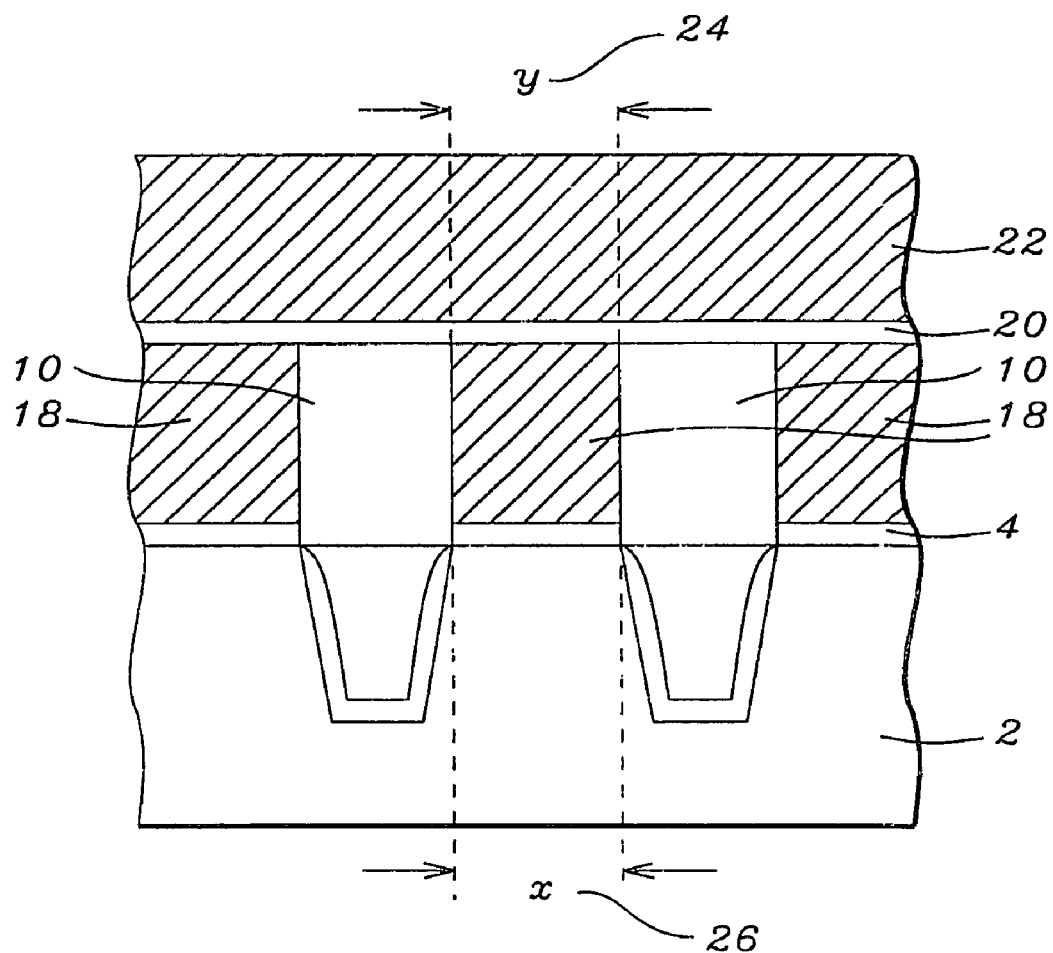
FIG. 1 – Prior Art
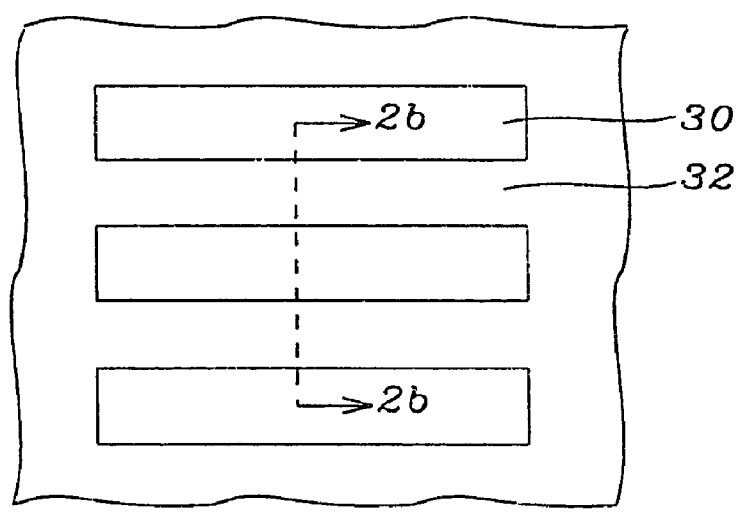
FIG. 2a

METHOD TO IMPROVE THE COUPLING RATIO OF TOP GATE TO FLOATING GATE IN FLASH

CROSS-REFERENCE TO RELATED APPLICATION

This application is a divisional of U.S. patent application Ser. No. 10/437,374, filed May 13, 2003, now abandoned which is a divisional of U.S. patent application Ser. No. 10/224,152, filed Aug. 20, 2002, now U.S. Pat. No. 6,579,761. This application is also a divisional of U.S. patent application Ser. No. 10/307,617, filed Dec. 02, 2002, now U.S. Pat. No. 6,916,722.

BACKGROUND OF THE INVENTION (1) Field of the Invention

The present invention relates generally to semiconductor integrated circuit technology and more particularly to split gate memory cells used in flash EEPROMs (Electrically Erasable Programmable Read Only Memory).

(2) Description of Prior Art

Increased performance in EEPROMS can be achieved by increased efficiency of the programming and erase operations In EEPROMs where a top gate controls a floating gate, improved programming and erase efficiency can be obtained by increasing the coupling ratio of the top gate to floating gate. The coupling ratio is essentially the ratio of the top gate-floating gate capacitance to the floating gate-substrate capacitance, so decreasing the floating gate-substrate capacitance relative to the top gate-floating gate capacitance increases the coupling ratio The greater the coupling ratio the larger is the fraction of the voltage applied to the top gate that falls across the floating gate-substrate capacitor. In traditional EEPROM flash memory cells the area of the top gate-floating gate capacitor is the same as the area of the floating gate-substrate capacitor This is illustrated in FIG. 1, which shows a cross-section of a typical design for a traditional EEPROM flash memory cell Here is shown a semiconductor substrate, 2, in which shallow trench isolation, 10, that extends above the substrate surface, separates active regions of memory cells The memory cells include floating gates, 18, formed from a poly 1 layer, and which are separated from ion implanted regions, 14, of the substrate by gate dielectrics, 4, thus forming the floating gate-substrate capacitors. Top gates, 22, formed from a poly 2 layer, are utilized as control gates and are separated from the floating gates by a dielectric layer, 20, thus forming the top gate-floating gate capacitors. In a traditional design the dimension of the top gate-floating gate capacitor, 24, denoted Y in FIG. 1 and the dimension of the floating gate-substrate capacitor, 26, denoted X in FIG. 1 are usually equal, and the dimensions of these capacitors perpendicular to the plane shown are equal as well. Thus the areas of these capacitors are usually equal, which limits the coupling ratio The coupling ratio depends on the ratio of the areas so that changing both areas by the same factor does not alter the coupling ratio Methods to increase the coupling ratio have been disclosed which involve increasing the area of the top gate-floating gate capacitor relative to the area of the floating gate-substrate capacitor. It is important to achieve the increased area of the top gate-floating gate capacitor without increasing the cell area, and methods exist to increase the coupling ratio in such a manner. Hsieh et al, in U.S. Pat. No. 6,153,494, disclose a method to increase the coupling ratio by lateral coupling in stacked-gate flash. Lin et al., in U.S. Pat. No. 6,225,162, show a step-shaped floating gate to improve the coupling ratio of flash memory cells. Chen, U.S. Pat. No. 6,140,182, discloses a memory cell in which vertical sides are used to increase the top gate-floating gate capacitance and thus increase the coupling ratio Other flash processes are disclosed in Sakamoto et al., U.S. Pat. No. 6,034,393 and in U.S. Pat. No. 6,312,989 to Hsieh et al. While increasing the top gate-floating gate capacitance increases the coupling ratio, considerable processing is required if the cell size is not to increase

SUMMARY OF THE INVENTION

It is a primary objective of the invention to provide a flash memory cell with increased coupling ratio of top gate to floating gate It is also a primary objective of the invention to provide a method of forming a flash memory cell with increased coupling ratio of top gate to floating gate. It is further primary objectives of the invention to achieve an increased coupling ratio of top gate to floating gate without increasing the cell size and without a considerable increase in processing. These objectives are achieved by a flash memory cell structure in which the floating gate is shaped so that the area of the floating gate to substrate capacitor is less than the area of the top gate to floating gate capacitor. The method of attaining such a shape for the floating gate according to the invention utilizes insulator spacers.

A structure is disclosed to improve the coupling ratio of top gate to floating gate in flash memory cells. Parallel active regions are surrounded by isolation regions and are disposed over a semiconductor region of a substrate. The isolation regions have a portion within and a portion above the semiconductor region The semiconductor region under the active regions is doped in the vicinity of the surface to adjust the threshold voltage. Insulator spacers are disposed against the sidewalls of the portion of the isolation regions that are above the semiconductor region and they taper so they are wider near the semiconductor region, and thus the spacing between neighboring insulator spacers on the same active region decreases closer to the semiconductor region Conductive floating gates spaced along the active regions are separated from the semiconductor region by a floating gate insulator layer, are disposed between insulator spacers and extend about to the height of the isolation regions. Top gates, comprised of conductive stripes that are perpendicular to the active regions, are disposed over floating gates from which they are separated by a top gate insulator layer.

BRIEF DESCRIPTION OF THE DRAWINGS

In the accompanying drawing forming a material part of this description, there is shown:

FIG. 1 shows a top gate and floating gate in a traditional flash memory cell.

FIGS. 2a, 3a, 4a and 5a show top views depicting methods of forming shaped floating gates according to the invention, in flash memory cells.

FIGS. 2b, 3b, 4c and 5c show cross sectional views depicting a method of forming shaped floating gates according to approach B of the invention, in flash memory cells.

DESCRIPTION OF THE PREFERRED EMBODIMENTS

It is a primary objective of the invention to provide a flash memory cell with increased coupling ratio of top gate to floating gate. It is also a primary objective of the invention to provide a method of forming a flash memory cell with increased coupling ratio of top gate to floating gate It is further primary objectives of the invention to achieve an increased coupling ratio of top gate to floating gate without increasing the cell size and without a considerable increase in processing. These objectives are achieved by a flash memory cell structure, described in detail below, in which the floating gate is shaped so that the area of the floating gate to substrate capacitor is reduced so that its area is significantly less than the area of the top gate to floating gate capacitor. The method of attaining such a shape for the floating gate involves an innovative utilization of insulator spacers. Among the advantages of achieving an increased coupling ratio by reducing the floating gate-substrate capacitor area relative to the area of the top-gate-floating gate capacitor, rather than by increasing the dielectric thickness of the floating gate-substrate capacitor area relative to the dielectric thickness of the top-gate-floating gate capacitor, is that in this way the field across the dielectric of the floating gate-substrate capacitor is increased, which is beneficial to the operation of the memory cell.

Figure 2B:
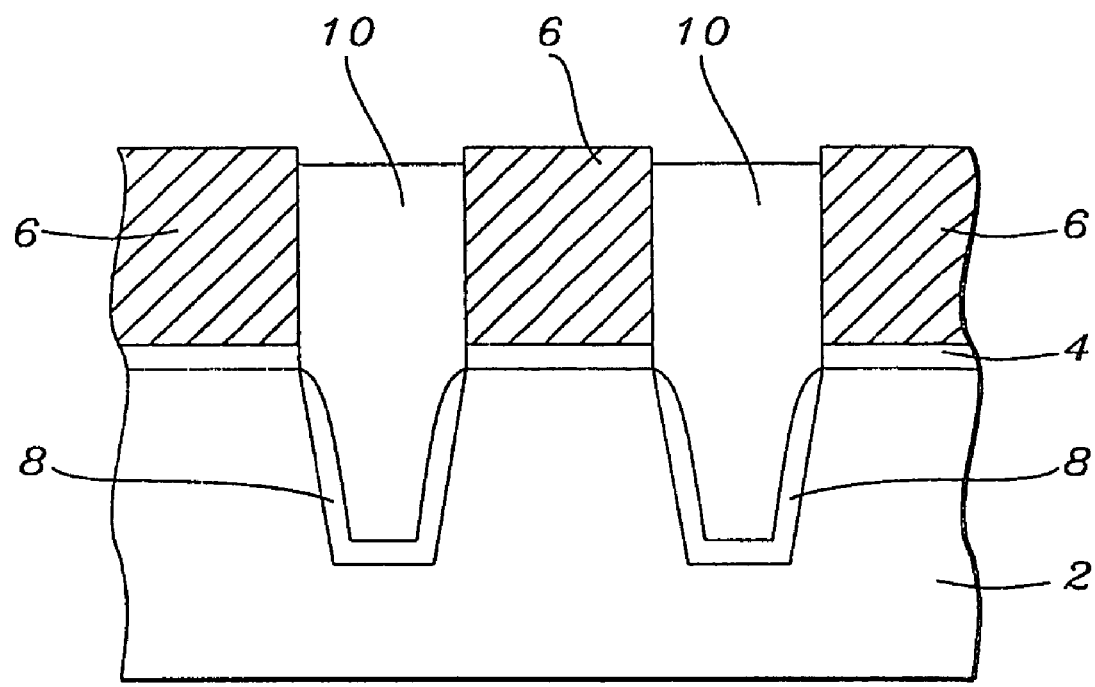
FIGS. 2b, 3b, 4b and 5b show cross sectional views depicting a method of forming shaped floating gates according to approach A of the invention, in flash memory cells.
Figure 3A:
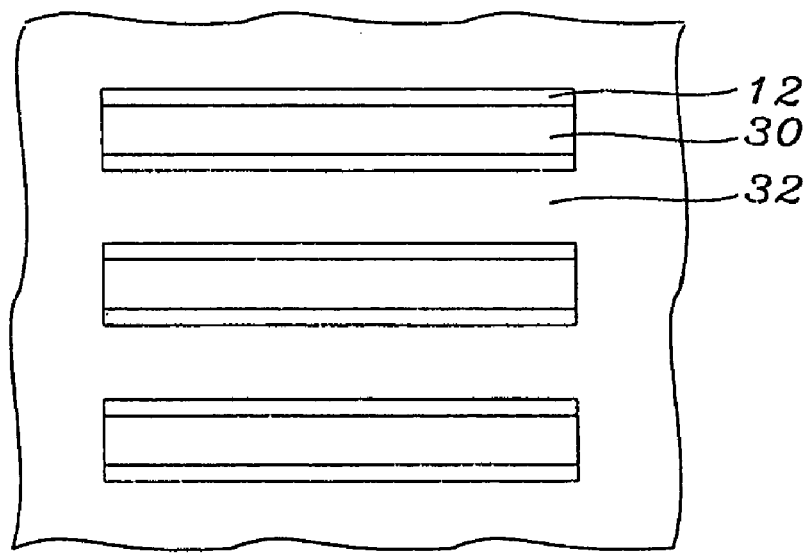
Figure 3B:
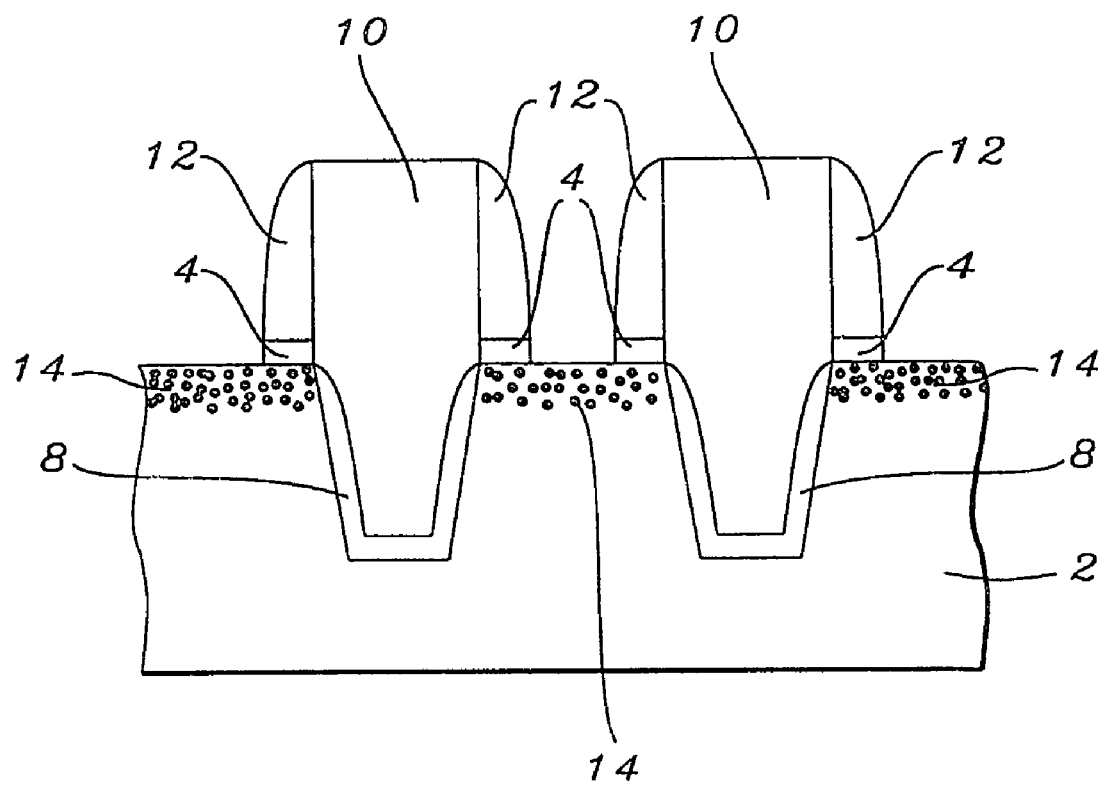
Figure 4A:
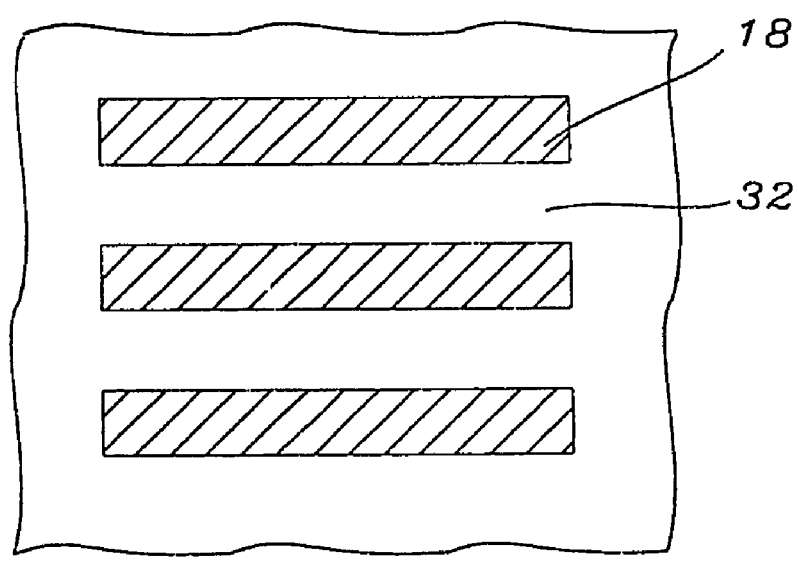
Figure 4B:
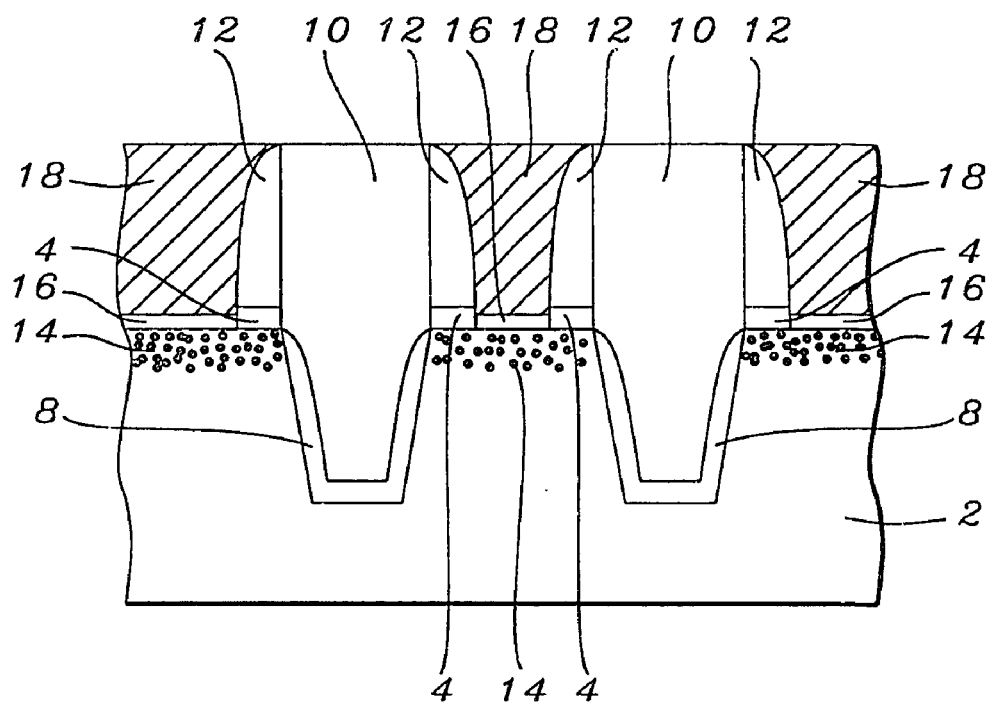
Figure 4C:
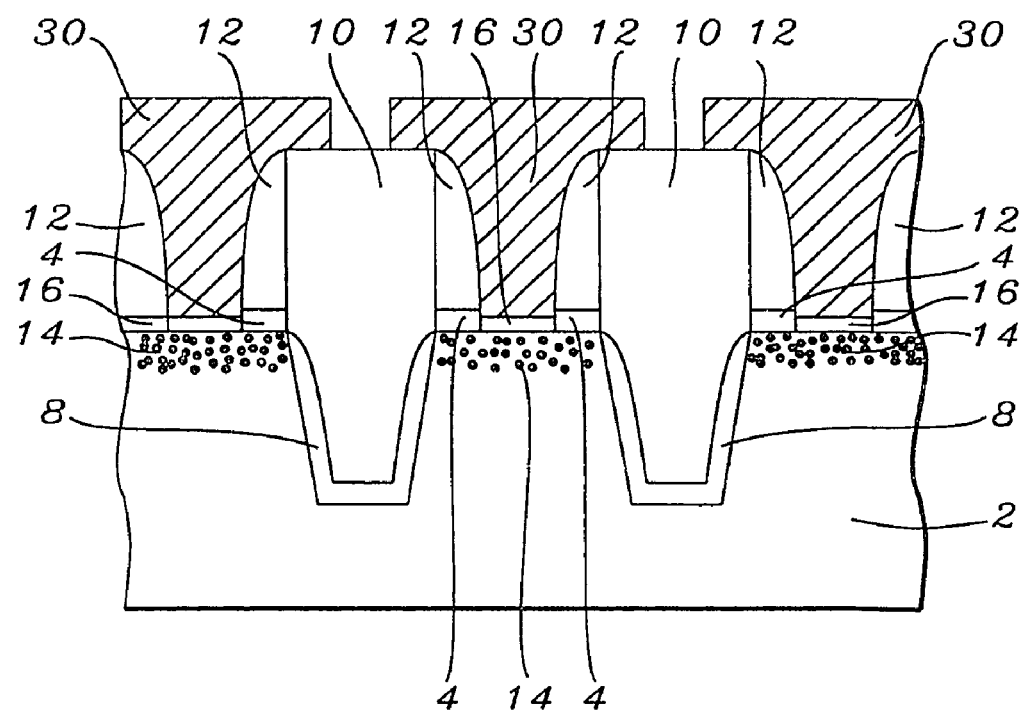
Figure 5A:
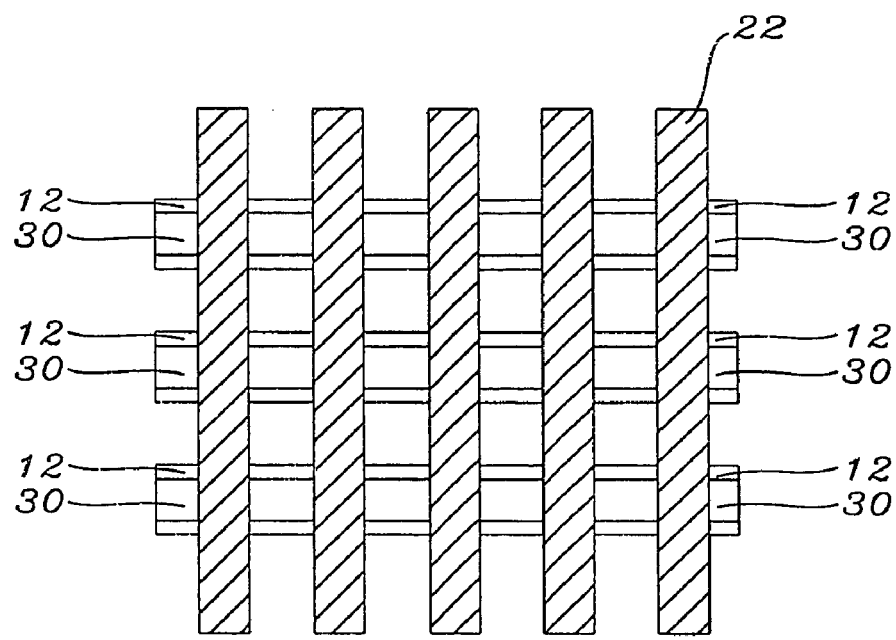
Figure 5B:
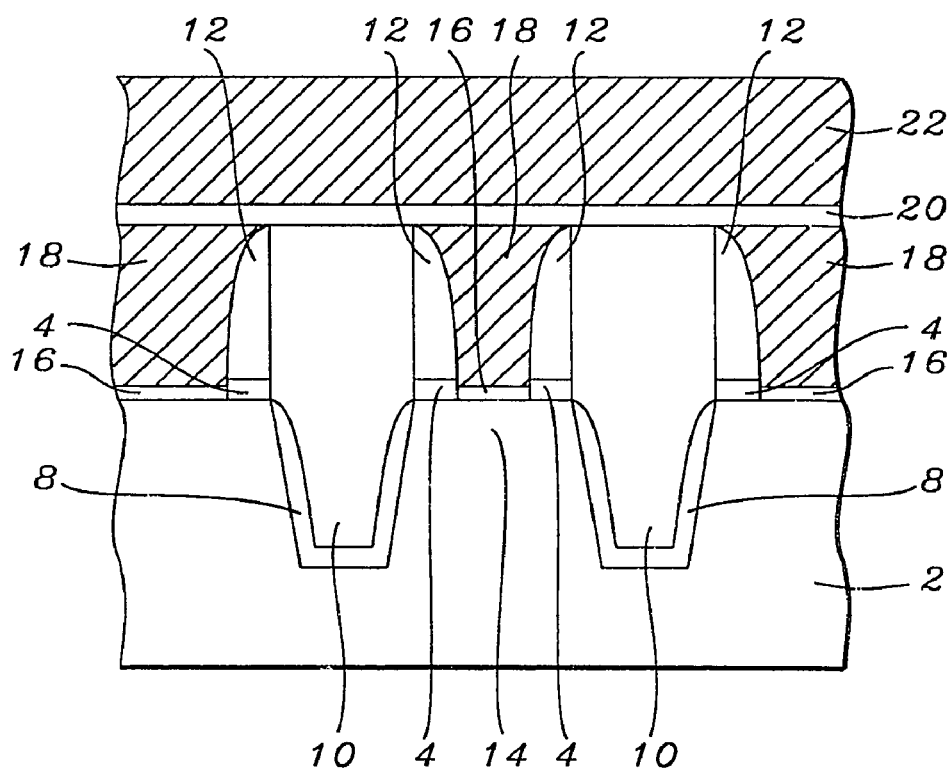
Figure 5C:
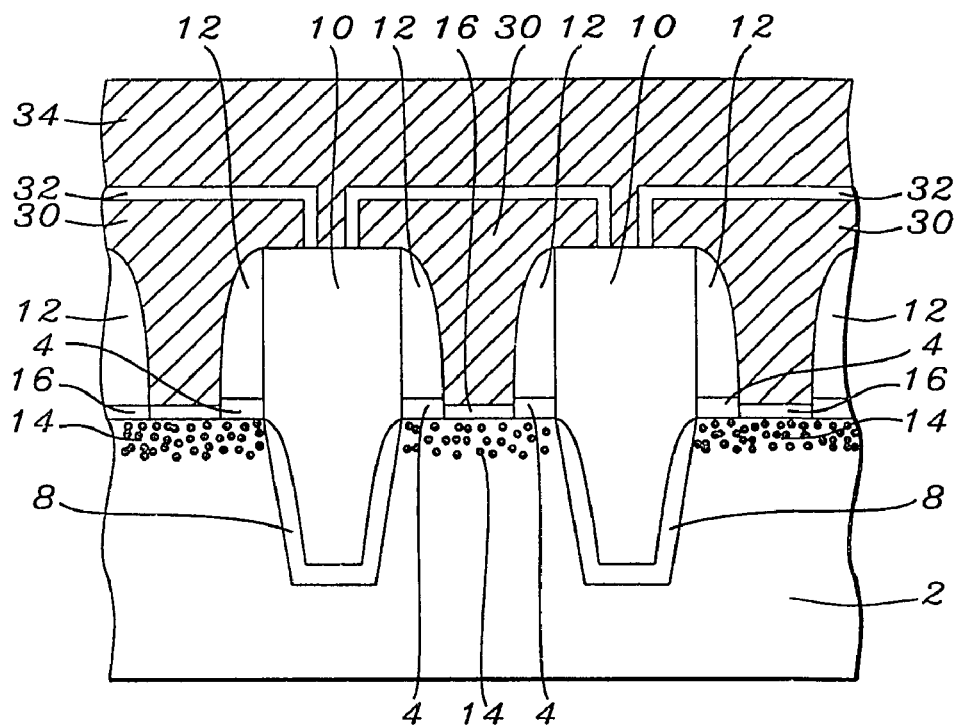
Figure 6:
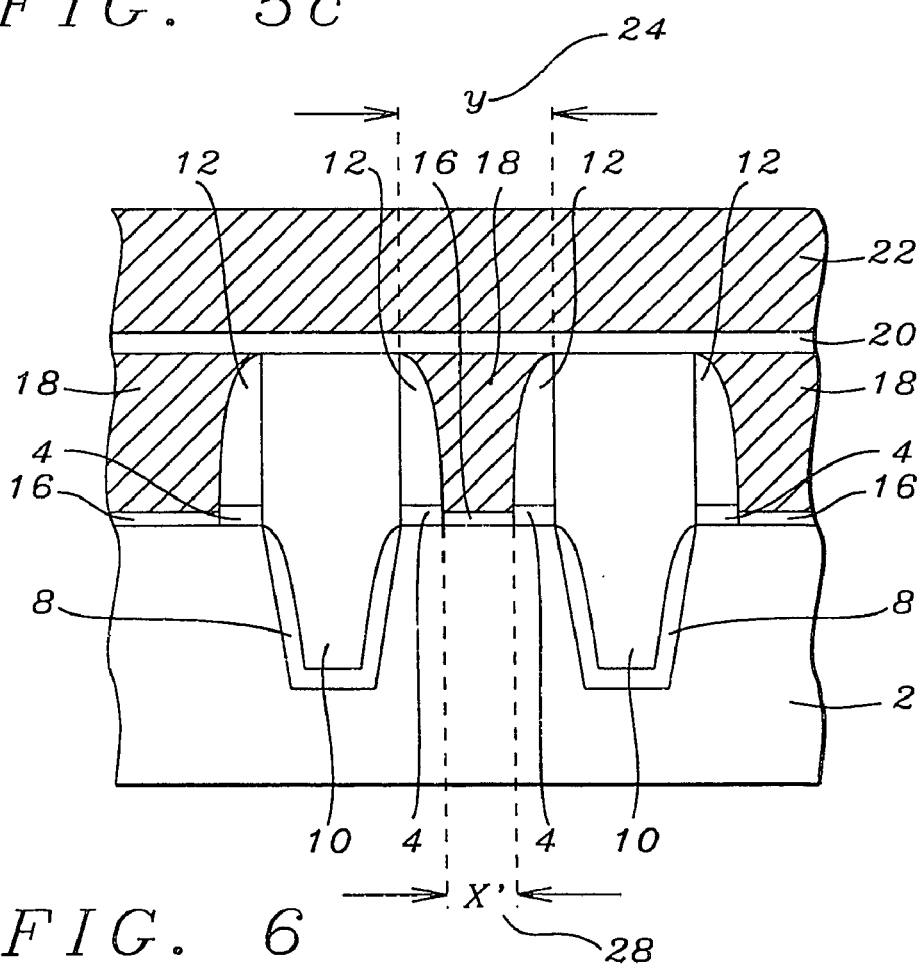
FIG. 6 shows a top gate and floating gate according to approach A of the invention, in a flash memory cell

Embodiments of the invention are well described with the aid of FIGS. 2a–6. FIGS. 2a, 3a, 4a and 5a show top views at progressive stages of the process FIGS. 2b, 3b, 4b and 5b show cross sectional views at progressive stages of the process for embodiments of the invention having a shaped floating gate of the first kind. FIGS. 2b, 3b, 4c and 5c show cross sectional views at progressive stages of the process for embodiments of the invention having shaped floating gates of the second kind. FIG. 6 indicates the capacitor areas for the floating gate to substrate capacitor and for the floating gate to top gate capacitor. In FIG. 2a is shown active regions, 30, surrounded by isolation regions, 32. Details of these regions, which are formed over a semiconductor region, 2, of a substrate, are shown in cross section, at an early stage of the process, in FIG. 2b, for preferred embodiments of the invention. To achiever the structure of FIG. 2b, a first insulator layer, preferably a grown pad oxide-1 layer about 110 Angstroms thick, is formed over the semiconductor region. Remnants of this first insulator layer, regions that are not etched in forming the isolation regions, are regions 4. A second insulator layer, 6, preferably a nitride layer about 1600 Angstroms thick, is formed that has good etching selectivity with respect to the first insulator layer and also with respect to the third and fourth insulator layers that are to be formed subsequently. This second insulator layer is patterned to define the active regions, i e. it is removed except for the areas to be occupied by active regions. Preferably, forming a photoresist layer, patterning the photoresist layer and etching the second insulator layer accomplish this patterning. The exposed first insulator layer is then etched followed by the formation of trenches by etching the exposed semiconductor region. In preferred embodiments of the invention, a lining layer, 8, which is a third insulator layer, is then formed over the trench bottoms and walls Preferably this lining layer is a thermally grown oxide-2 layer about 200 Angstroms thick. Next a fourth insulator layer, 10, is deposited filling the trenches and also filling the extensions of the trenches that extend above the semiconductor region and that are bounded by the patterned second insulator layer. In preferred embodiments of the invention the fourth insulator layer is an HDP oxide-3 layer about 6000 Angstroms thick. A CMP step, stopping on the second insulator, planerizes the structure to the level of the top of the second insulator layer, as shown in FIG. 2b. Removal of the remaining second insulator layer, 6, follows, exposing the sides of the fourth insulator layer, 10, which extend above the level of the first insulator layer, 4. An implant is then performed, resulting in a doped section, 14, diffusion sections of the semiconductor region. The implant is required to adjust the threshold voltage. Preferably the implant is a boron implant at energy of about 60 keV, to a dose of about 2E13 per cm$^2$ Formation of insulator spacers, 12, against these exposed sides, which is basic to the invention, then follows. This is accomplished by first depositing a fifth insulator layer, which preferably is a deposition of about 800 Angstroms of TEOS oxide-4 A spacer etch of the fifth insulator layer, which also removes exposed portions of first insulator layer, than gives rise to the tapered shape of the spacers, 12, that is wider near the semiconductor region as shown in FIG. 3b At this point it is preferred to form a sacrificial oxide layer over exposed semiconductor region, a layer that is then removed. The purpose of the layer is to improve the quality of the semiconductor region in the vicinity of the surface. FIG. 3a shows a top view of the structure at this stage of the process. A fifth insulator layer, which is a floating gate insulator layer, is formed. Preferably the fifth insulator layer is a thermally grown oxide-5 layer that is about 90 Angstroms thick A deposition of a first conductor layer follows, which preferably is a doped poly-1 deposition to a thickness of about 2000 Angstroms.

There are two approaches defined by the following process steps that lead to two main versions of the preferred embodiments of the invention. In approach A, an etch back of the first conductor layer is performed, leaving first conductor, 18, only between the spacers, 12, below the top level of the isolation regions, 10. This is shown in the cross sectional view of FIG. 4b A top view of the structure at this stage of the process is shown in FIG. 4a Regions 18 will form the floating gates, which in approach A are self aligned to the diffusion sections, 14 A sixth insulator layer, region 20 of FIG. 5b, is then formed, which will be the dielectric layer of the top gate to floating gate capacitor. Preferably the sixth insulator layer is an ONO layer with the bottom oxide layer being an oxide layer about 70 Angstroms thick, the nitride layer being about 160 Angstroms thick and the top oxide layer being about 40 Angstroms thick. Next a deposition of a second conductor layer is performed which will form the top gates. Preferably the second conductor layer is a doped polysilicon layer about 2500 Angstroms thick. The second conductor layer is patterned to form conductive parallel stripes, 22, as shown in FIG. 5a. These conductive parallel stripes act as the top gates. In preferred embodiments of the invention forming a photoresist layer, patterning the photoresist layer and then etching the second conductor layer accomplish patterning of the second conductor layer. Finally the portions of sixth insulator layer and first conductor layer that are not under the second conductor layer top gates are removed. When photoresist is used to achieve the patterning of the second conductor layer, removal of these portions is conveniently performed by etching while the photoresist layer masks the parts that should remain. Subsequent to the etching of the sixth insulator layer and first conductor layer the photoresist layer is removed The structure resulting from approach A is shown in FIGS. 5a and 5b How an increased coupling ratio of top gate to floating gate is achieved in approach A of the invention is depicted in FIG. 6. The area of the top gate to floating gate capacitor is the top width of the floating gate, Y designated by 24 in FIG. 6, times the width of the second conductor stripes. The area of the floating gate to substrate capacitor is the bottom width of the floating gate, X' designated by 28 in FIG. 6, times the width of the second conductor stripes. The ratio of the areas is thus Y/X' which can be significantly larger than one, which is the ratio Y/X for traditional methods in which X=Y Thus with only the additional processing required to form the insulator spacers a significant increase in the top gate to floating gate coupling ratio is achieved by the approach A of the invention. This increases the programming and erasing efficiency of the flash memory cell. Furthermore the floating gate, in this approach, is self-aligned to the diffusion and can more easily be reduced in size to achieve higher cell densities.

Figure 7:
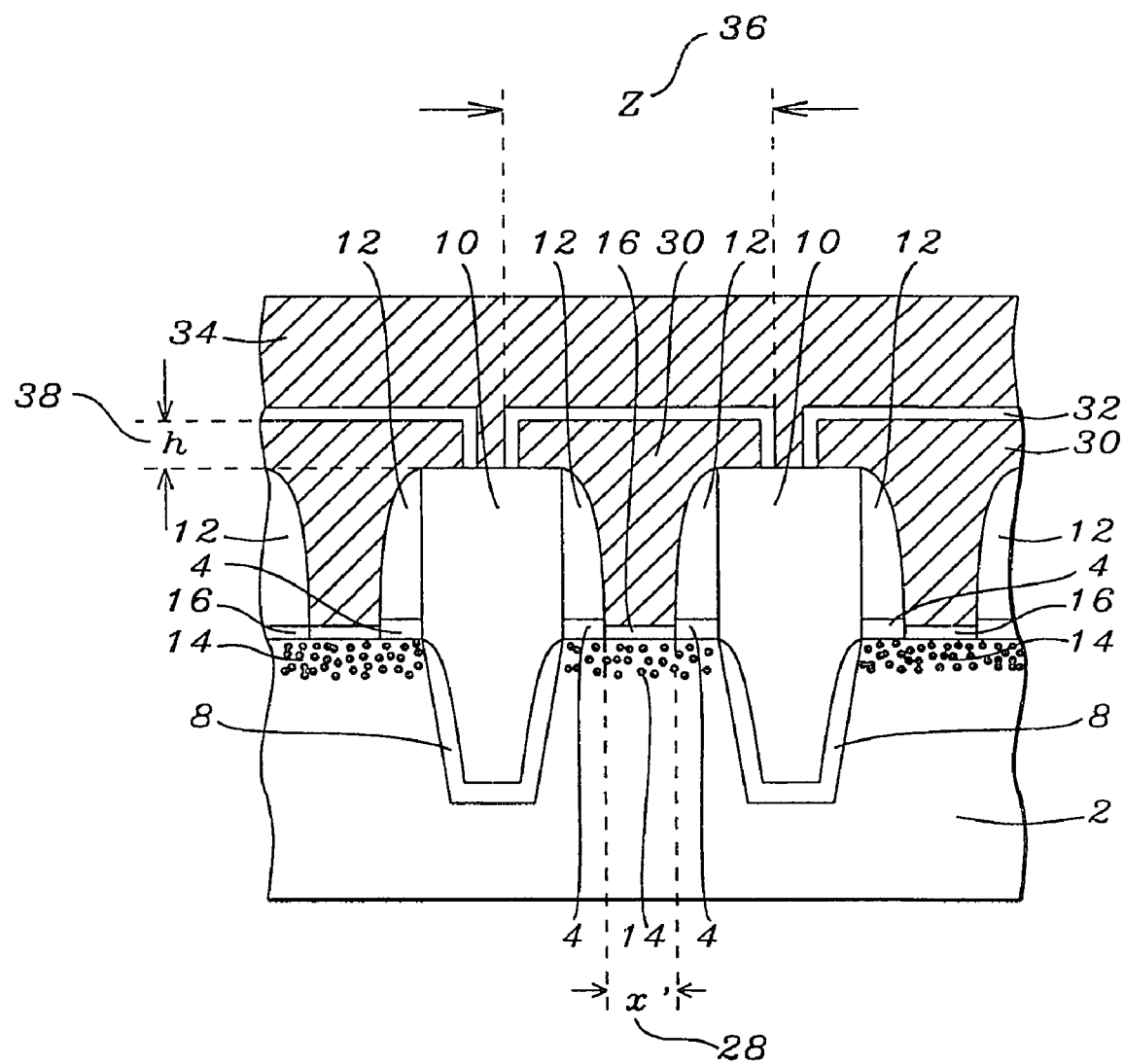
FIG. 7 shows a top gate and floating gate according to approach B of the invention, in a flash memory cell.

In approach B, shown in FIGS. 4c and 5c, the first conductor layer is patterned to form stripes, 30, over the active regions, 30, and that also overlap the neighboring isolation regions, 32. A preferred method to achieve the patterning is to form a photoresist layer over the first conductor layer, pattern the photoresist layer, etch the first conductor layer and remove the photoresist layer. This structure is shown in the cross sectional view of FIG. 4c. A top view of the structure at this stage of the process is similar to that shown in FIG. 4a for approach A, except that in approach B the first conductor layer overlaps the isolation regions so not all of region 32 is visible in a top view. Regions 30 will form the floating gates, which in approach B are not self aligned to the diffusion sections, 14. However, this is compensated for in that a greater coupling ratio can result in approach B because of increased top gate to floating gate capacitor area. A sixth insulator layer, region 32 of FIG. 5c, is then formed, which will be the dielectric layer of the top gate to floating gate capacitor. Preferably the sixth insulator layer is an ONO layer with the bottom oxide layer being an oxide layer about 70 Angstroms thick, the nitride layer being about 160 Angstroms thick and the top oxide layer being about 40 Angstroms thick. Next a deposition of a second conductor layer is performed which will form the top gates. Preferably the second conductor layer is a doped polysilicon layer about 2500 Angstroms thick. The second conductor layer is patterned to form conductive parallel stripes, 34, similar to regions 22 of approach A shown in FIG. 5a, except that the cross sections are as shown in FIG. 5c, These conductive parallel stripes act as the top gates. In preferred embodiments of the invention forming a photoresist layer, patterning the photoresist layer and then etching the second conductor layer accomplish patterning of the second conductor layer Finally the portions of sixth insulator layer and first conductor layer that are not under the second conductor layer top gates are removed When photoresist is used to achieve the patterning of the second conductor layer, etching conveniently performs removal of these portions while the photoresist layer masks the parts that should remain Subsequent to the etching of the sixth insulator layer and first conductor layer the photoresist layer is removed. The structure resulting from approach B is shown in FIG. 5c How an increased coupling ratio of top gate to floating gate is achieved in approach B of the invention is depicted in FIG. 7. The area of the top gate to floating gate capacitor is given by the sum of the top width of the floating gate, Z designated by 36 in FIG. 7, and twice the height of the floating gate above the isolation region, h, designated by 38 in FIG. 7, times the width of the second conductor stripes. The area of the floating gate to substrate capacitor is the bottom width of the floating gate, X' designated by 28 in FIG. 7, times the width of the second conductor stripes. The ratio of the areas is thus (Z+2 h)/X', which is larger than Y/X', the ratio of areas in approach A, and which can be significantly larger than one, which is the ratio Y/X for traditional methods in which X=Y. Thus with only the additional processing required to form the insulator spacers a significant increase in the top gate to floating gate coupling ratio is achieved by the approach A of the invention. This increases the programming and erasing efficiency of the flash memory cell. The floating gate, in approach B, is not self-aligned to the diffusion as it is in approach A, but this is compensated by the larger coupling ratio in approach B.

While the invention has been particularly shown and described with reference to the preferred embodiments thereof, it will be understood by those skilled in the art that various changes in form and detail may be made without departing from the spirit and scope of the invention.

What is claimed is:

1. A structure to improve the coupling ratio of top gate to floating gate in flash memory cells, comprising:
   parallel active regions, surrounded by isolation regions, over a semiconductor region of a substrate, said isolation regions having a portion within and a portion above said semiconductor region, and where the semiconductor region under said active regions is doped in the vicinity of the surface to adjust the threshold voltage;
   insulator spacers disposed against the sidewalls of the portion of said isolation regions that are above said semiconductor region and that taper so they are wider near said semiconductor region, and thus the spacing between neighboring insulator spacers on the same active region decreases closer to said semiconductor region;
   conductive floating gates spaced along said active regions and electrically isolated from each other, separated from said semiconductor region by a floating gate insulator layer and disposed between insulator spacers, wherein a portion of each conductive floating gate overlaps said isolation regions, said portion of said conductive floating gate overlapping said isolation regions has a top surface and sidewalls above said isolation regions, and said sidewalls are substantially perpendicular to said top surface; and
   top gates comprised of conductive stripes perpendicular to said active regions, disposed over floating gates from which they are separated by a top gate insulator layer.

2. The structure of claim 1 wherein said isolation regions are oxide filled shallow trench isolation regions.

3. The structure of claim 1 wherein said semiconductor region is a silicon region.

4. The structure of claim 1 wherein said doping of the semiconductor region is accomplished by boron implantation at energy about 60 keV to a dose of about 2E13 per cm2.

5. The structure of claim 1 wherein said insulator spacers are composed of TEOS oxide.

6. The structure of claim 1 wherein said floating gate insulator layer is a thermally grown oxide about 90 Angstroms thick.

7. The structure of claim 1 wherein said conductive floating gates are composed of doped polysilicon.

8. The structure of claim 1 wherein said top gates are composed of doped polysilicon.

9. The structure of claim 1 wherein said top gate insulator layer is an ONO layer with the bottom oxide layer being about 70 Angstroms thick, the nitride layer being about 160 Angstroms thick and the top oxide layer being about 40 Angstroms thick.

* * * * *